(12) United States Patent
Huang et al.

(10) Patent No.: US 11,289,646 B2
(45) Date of Patent: Mar. 29, 2022

(54) METHOD OF FORMING A BOTTOM ELECTRODE OF A MAGNETORESISTIVE RANDOM ACCESS MEMORY CELL

(71) Applicant: Taiwan Semiconductor Manufacturing Co., Ltd., Hsin-Chu (TW)

(72) Inventors: Wei-Chieh Huang, Hsinchu County (TW); Jieh-Jang Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/741,250

(22) Filed: Jan. 13, 2020

(65) Prior Publication Data

US 2020/0152863 A1 May 14, 2020

Related U.S. Application Data

(60) Continuation of application No. 15/834,670, filed on Dec. 7, 2017, now Pat. No. 10,535,815, which is a division of application No. 15/096,574, filed on Apr. 12, 2016, now Pat. No. 9,847,477.

(51) Int. Cl.
*H01L 43/12* (2006.01)
*H01L 43/08* (2006.01)

(52) U.S. Cl.
CPC .............. *H01L 43/12* (2013.01); *H01L 43/08* (2013.01)

(58) Field of Classification Search
CPC ... H01L 2924/1441; H01L 27/222–228; H01L 43/00–14; H01L 21/28291; H01L 45/04–065; H01L 45/14–144; H01L 45/16–1691; G11C 13/00–06; G11C 11/15; G11C 19/08; G11C 14/0036; G11C 14/0081; G11C 11/22–2297; G11C 11/5678; G11C 13/0004
See application file for complete search history.

(56) References Cited

U.S. PATENT DOCUMENTS

| | | | |
|---|---|---|---|
| 7,667,271 B2 | 2/2010 | Yu et al. |
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |

(Continued)

*Primary Examiner* — Cuong B Nguyen
(74) *Attorney, Agent, or Firm* — Haynes and Boone, LLP

(57) ABSTRACT

A method of fabricating a semiconductor device is disclosed. The method includes forming an opening with a tapered profile in a first material layer. An upper width of the opening is greater than a bottom width of opening. The method also includes forming a second material layer in the opening and forming a hard mask to cover a portion of the second material layer. The hard mask aligns to the opening and has a width smaller than the upper width of the opening. The method also includes etching the second material layer by using the hard mask as an etch mask to form an upper portion of a feature with a tapered profile.

20 Claims, 13 Drawing Sheets

(56) References Cited

U.S. PATENT DOCUMENTS

| | | |
|---|---|---|
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 2008/0135901 A1 | 6/2008 | Shimojo et al. |
| 2009/0189141 A1* | 7/2009 | Shin ............... H01L 45/143 257/4 |
| 2010/0200900 A1 | 8/2010 | Iwayama |
| 2011/0241140 A1 | 10/2011 | Tsujiuchi et al. |
| 2013/0292820 A1 | 11/2013 | Kang |
| 2014/0001574 A1 | 1/2014 | Chen et al. |
| 2014/0110755 A1 | 4/2014 | Colinge |
| 2014/0151812 A1 | 6/2014 | Liaw |
| 2014/0284743 A1 | 9/2014 | Aikawa et al. |
| 2016/0072045 A1* | 3/2016 | Kanaya ............... H01L 43/08 257/427 |
| 2016/0276257 A1 | 9/2016 | Kuramochi et al. |
| 2016/0336260 A1 | 11/2016 | Mitsuhashi |
| 2016/0365505 A1* | 12/2016 | Lu ..................... H01L 43/08 |
| 2017/0294576 A1 | 10/2017 | Huang et al. |

* cited by examiner

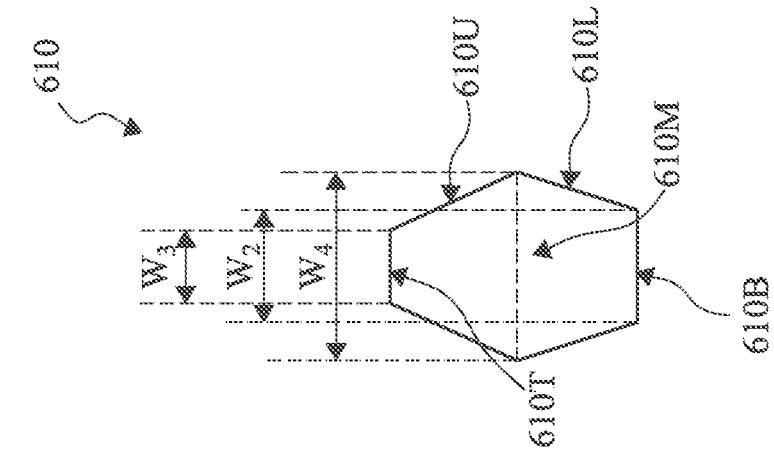
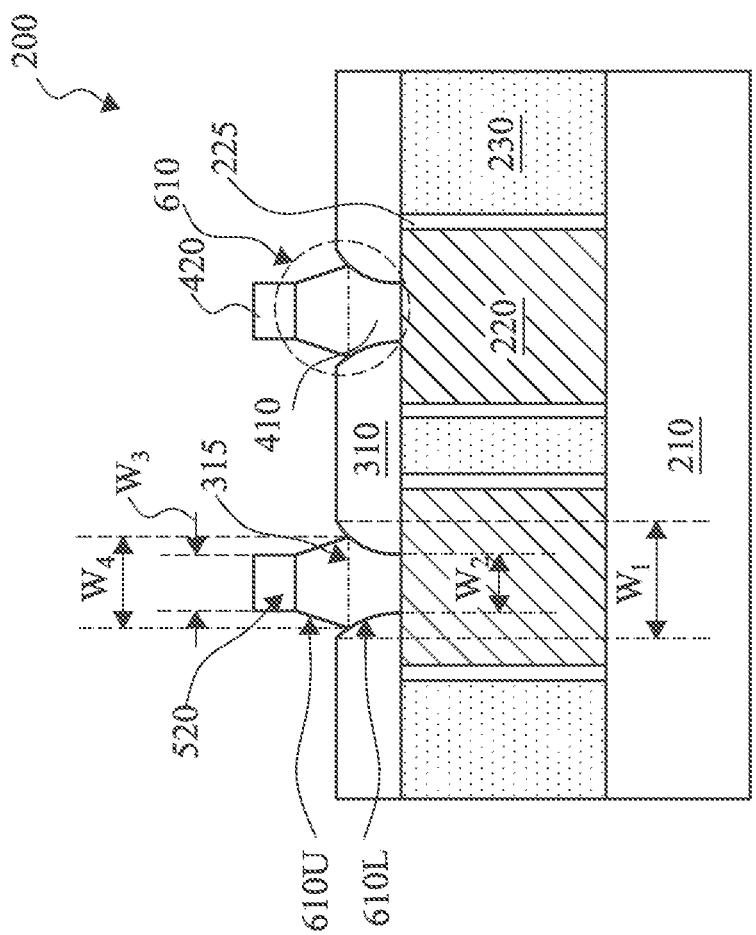
FIG. 8B
FIG. 8A

METHOD OF FORMING A BOTTOM ELECTRODE OF A MAGNETORESISTIVE RANDOM ACCESS MEMORY CELL

PRIORITY DATA

The present application is a continuation of U.S. application Ser. No. 15/834,670, filed Dec. 7, 2017, which is a divisional of U.S. application Ser. No. 15/096,574, filed April 12, each of which is incorporated herein by reference in its entirety.

BACKGROUND

The semiconductor integrated circuit (IC) industry has experienced rapid growth. Technological advances in IC design and material have produced generations of ICs where each generation has smaller and more complex circuits than previous generations. In IC devices, magnetoresistive random access memory (MRAM), resistive random-access memory (RRAM), conductive bridging RAM (CBRAM), are next emerging technologies for next generation embedded memory devices. As an example, MRAM is a memory device including an array of MRAM cells, each of which stores a bit of data using resistance values, rather than electronic charge. Each MRAM cell includes a magnetic tunnel junction ("MTJ") cell, the resistance of which can be adjusted to represent logic "0" or logic "1". The MTJ includes a stack of films. The MTJ cell is coupled between top and bottom electrodes and an electric current flowing through the MTJ cell from one electrode to the other may be detected to determine the resistance, and therefore the logic state. Although existing methods of fabricating next generation of embedded memory devices have been generally adequate for their intended purposes, they have not been entirely satisfactory in all respects. For example, improvements in forming a bottom electrode are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9, 10A, 10B, 11, 12 and 13 are cross-sectional views of an example semiconductor device in accordance with some embodiments.

DETAILED DESCRIPTION

Figure 1:
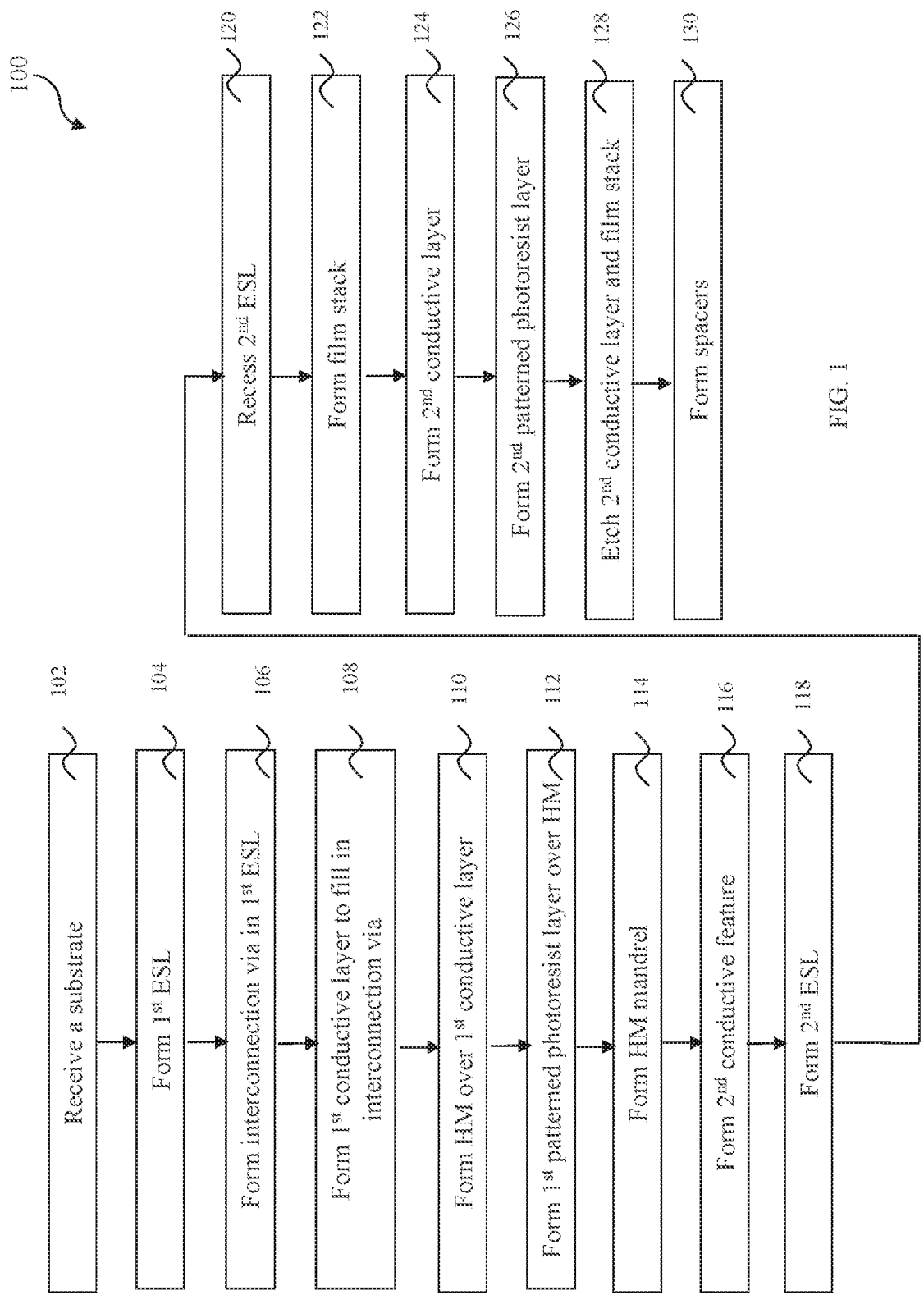
FIG. 1 is a flowchart of an example method for fabricating a semiconductor device constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a semiconductor device 200, shown in FIGS. 2, 3, 4, 5, 6, 7, 8A, 8B, 9, 10A, 10B, 11, 12 and 13.

Figure 2:
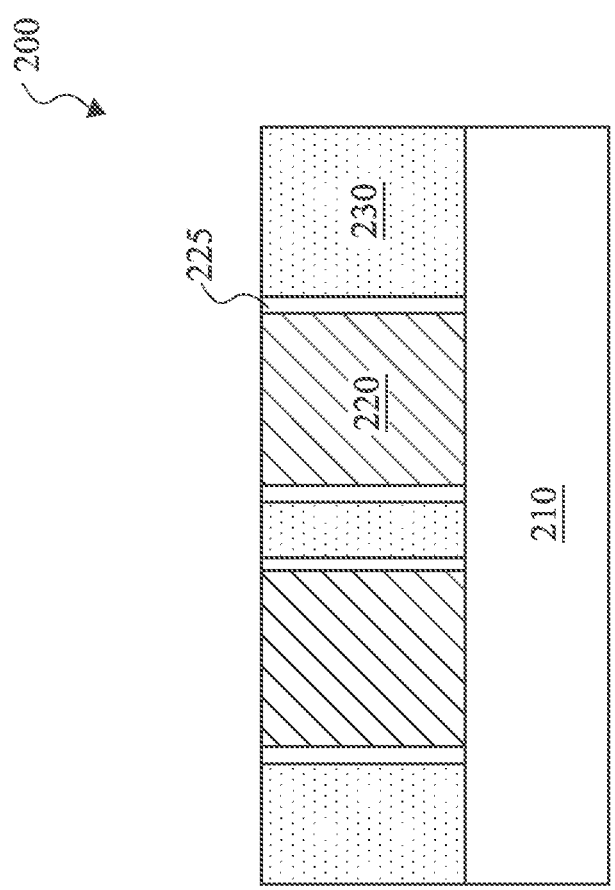

Referring to FIGS. 1 and 2, the method 100 begins at step 102 by providing a substrate 210. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation regions. The isolation regions separate various device regions in the substrate 210. The isolation regions include different structures formed by using different processing technologies. For example, the isolation region may include shallow trench isolation (STI) regions. The formation of an STI may include etching a trench in the substrate 210 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include a plurality of inter-level dielectric (ILD) layers such as silicon oxide, silicon nitride, silicon oxynitride, a low-k dielectric, silicon carbide, and/or other suitable layers. The ILD may be deposited by thermal oxidation chemical vapor deposition (CVD), atomic layer deposition (ALD), physical vapor deposition (PVD), thermal oxidation, combinations thereof, or other suitable techniques.

The substrate 210 also includes a plurality of first conductive features 220. The first conductive features 220 may include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, and/or other suitable techniques. The IL may include oxide, HfSiO and oxynitride and the HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode may include Ti, Ag, Al, TiAlN, TaC, TaCN, TaSiN, Mn, Zr, TiN, TaN, Ru, Mo, Al, WN, Cu, W, any suitable materials and/or a combination thereof.

The first conductive features 220 may also include source/drain (S/D) features, which include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. The S/D features 220 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes.

The first conductive features 220 may also include conductive features integrated with the ILD layer in the substrate 210 to form an interconnect structure configured to couple the various p-type and n-type doped regions and the other functional features (such as gate electrodes), resulting a functional integrated circuit. In one example, the features 220 may include a portion of the interconnect structure and the interconnect structure includes a multi-layer interconnect (MLI) structure and an ILD layer over the substrate 210 integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

In one embodiment, a barrier 225 is formed along sidewalls of the first conductive features 220. The barrier 225 may include titanium nitride (TiN), tantalum nitride (TaN), tungsten nitride (WN), titanium silicon nitride (TiSiN), tantalum silicon nitride (TaSiN), and/or other suitable materials. The barrier 225 may be formed by CVD, PVD, ALD, and/or other suitable techniques.

The substrate 210 may also include a dielectric layer 230 such that it fills in spaces between first conductive features 220. The dielectric layer 230 may include a dielectric material layer, such as silicon oxide, silicon nitride, a dielectric material layer having a dielectric constant (k) lower than thermal silicon oxide (therefore referred to as low-k dielectric material layer), and/or other suitable dielectric material layer. A process of forming the dielectric layer 230 may include CVD, spin-on coating, and/or other suitable techniques. In the present embodiment, a chemical mechanical polishing (CMP) process is performed to remove excessive dielectric layer 230 such that top surfaces of the first conductive features 220 are exposed without being covered by the dielectric layer 230.

Figure 3:
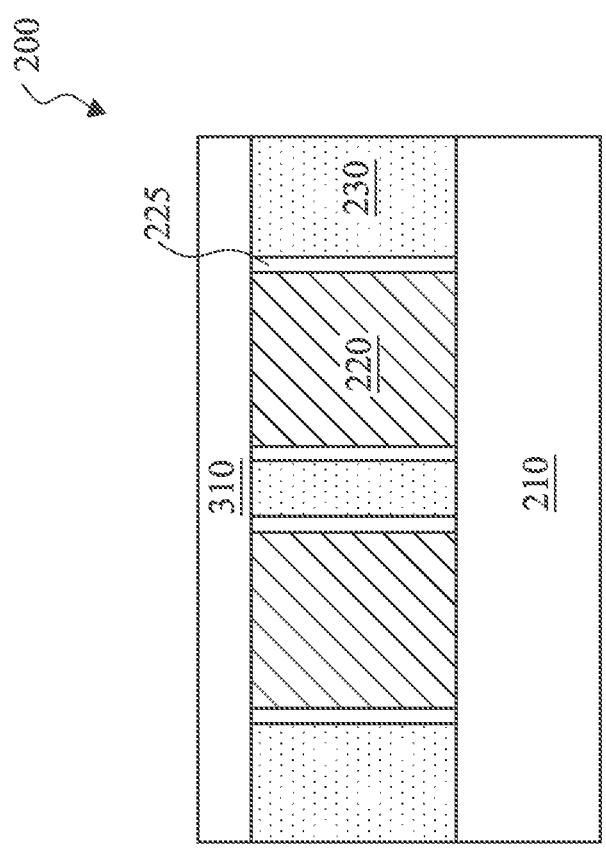

Referring to FIGS. 1 and 3, method 100 proceeds to step 104 by forming first etch-stop-layer ESL 310 over the first conductive features 220 and the dielectric layer 230. The first ESL 310 may include silicon nitride, oxynitride, silicon carbide, titanium oxide, titanium nitride, tantalum oxide, tantalum nitride, and/or any suitable materials. The first ESL 310 may be deposited by a suitable technique, such as CVD, PVD, ALD, and/or other suitable technique.

Figure 4:
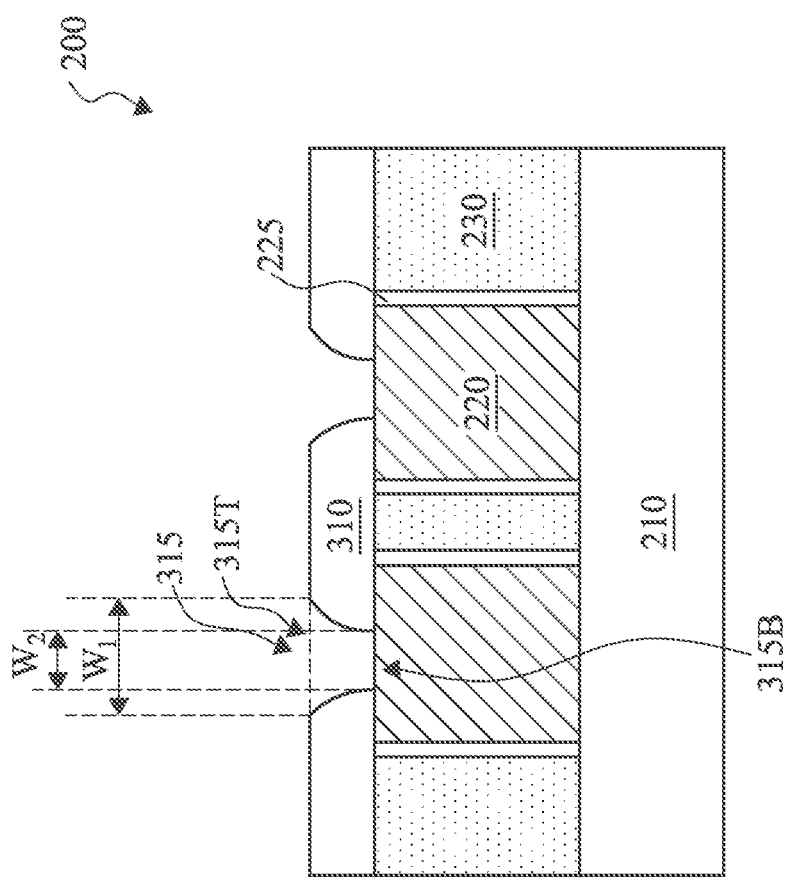

Referring to FIGS. 1 and 4, method 100 proceeds to step 106 by forming a plurality openings (or interconnection vias) 315 in the first ESL 310 to expose a portion of the top surface of respective first conductive feature 220. In the present embodiment, the interconnection via 315 has a tapered (or reversed tapered) profile with a wider opening at its top opening. In other words, the interconnection via 315 has a first width $w_1$ at the top opening 315T and a second width $w_2$ at the bottom opening 315B. The first width $w_1$ is greater than the second width $w_2$. A tapered profile of the interconnection via 315 will relax process constrains of gap filling in a subsequent process, which will be described later.

In an embodiment, the interconnection vias 315 are formed by forming a patterned photoresist layer over the first ESL 310 using a photolithography process including photoresist coating, soft baking, exposing, post-exposure baking (PEB), developing, and hard baking. Then, the first ESL 310 is etched through the patterned photoresist layer to form the plurality of interconnection vias 315. The patterned photoresist layer is removed thereafter using a suitable process, such as wet stripping or plasma ashing.

In an embodiment, a tunable etching process is performed to achieve the tapered profile. For example, the etching parameters, such as etchant or an electric bias to a dry etching, can be continuously tuned to form the interconnection via 315 with the tapered profile. In another embodiment, a dry etching process and a wet etching process are combined to form the interconnection via 315. For example, a dry etching is applied first and a wet etching process is applied thereafter such that the interconnection via 315 has a tapered profile. In yet another embodiment, a dry etching is applied first and followed by an argon sputtering to widen top opening 315T.

A dry etching process may implement chlorine-containing gas (e.g., $Cl_2$, $CHCl_3$, $CCl_4$, and/or $BCl_3$), bromine-containing gas (e.g. HBr and/or $CHBr_3$), iodine-containing gas, fluorine-containing gas (e.g., $CF_4$, $SF_6$, $CH_2F_2$, $CHF_3$, and/or $C_2F_6$), and/or other suitable gases and/or plasmas, and/or combinations thereof. A wet etching solution may include $HNO_3$, $NH_4OH$, KOH, HF, HCl, NaOH, $H_3PO_4$, TMAH, and/or other suitable wet etching solutions, and/or combinations thereof.

Figure 5:
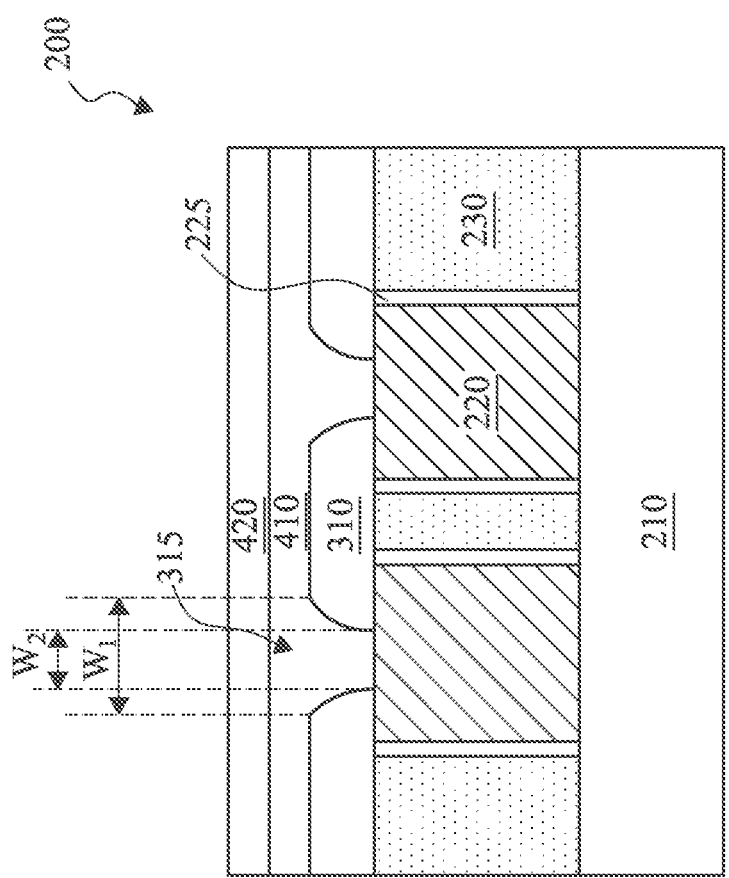

Referring to FIGS. 1 and 5, method 100 proceeds to step 108 by forming a first conductive layer 410 over the first ESL 310. In the present embodiment, the first conductive layer 410 may include a bottom electrode layer of a MRAM device. The bottom electrode layer 410 may include titanium (Ti), tantalum (Ta), platinum (Pt), ruthenium (Ru), titanium nitride (TiN), tantalum nitride (TaN), and/or other suitable materials. The first conductive layer 410 may be formed by formed by CVD, PVD, ALD, and/or other suitable techniques.

In the present embodiment, the first conductive layer 410 fully (or completely) fills in the interconnection via 315 and extends to above the first ESL 310. As has been mentioned above, with the taper profile, the first conductive layer 410 conformably fills in the interconnection via 315 and prevents gap-filling issues such as void formation issue. The first conductive layer 410 physically contacts the conductive feature 220 within the interconnection via 315. In some embodiments, a CMP process is performed to polish back excessive the first conductive layer 410 and planarize the top surface of the first conductive layer 410.

Referring again to FIGS. 1 and 5, method 100 proceeds to step 110 by forming a hard mask (HM) 420 over the first conductive layer 410. The HM layer 420 may include silicon oxide, silicon nitride, oxynitride, silicon carbide, titanium oxide, titanium nitride, tantalum oxide, tantalum nitride, and/or any suitable materials. In some embodiment, the HM 420 is different from the first conductive layer 410 to achieve etching selectivity in subsequent etches The HM layer 420 may be deposited by a suitable technique, such as CVD, PVD, ALD, spin-on coating, and/or other suitable technique.

Figure 6:
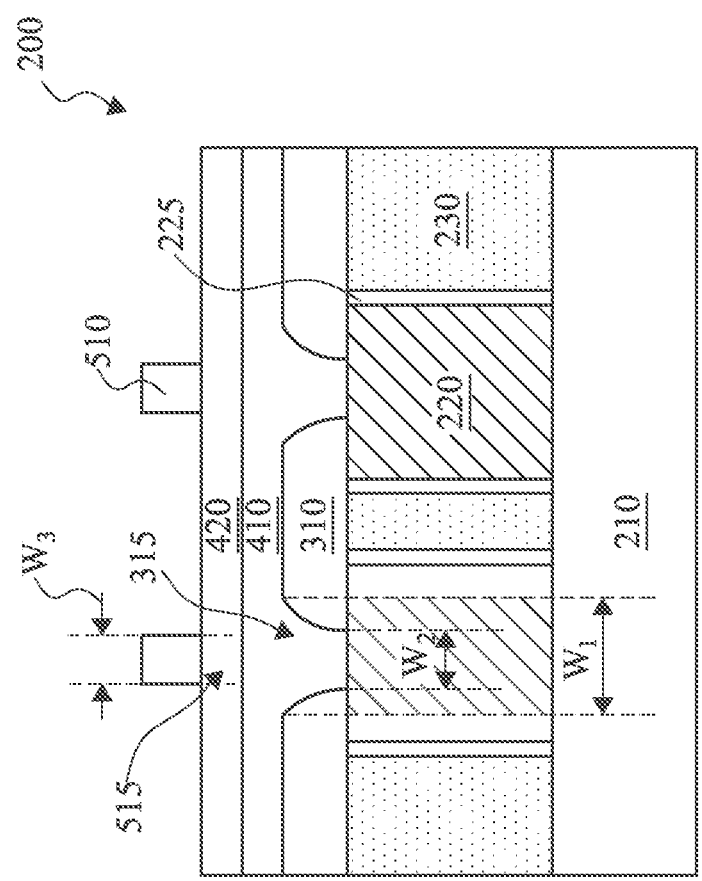

Referring to FIGS. 1 and 6, method 100 proceeds to step 112 by forming a first patterned photoresist layer 510 over the HM 420. The first patterned photoresist layer 510 is formed by a photolithography process including photoresist coating, soft baking, exposing, post-exposure baking (PEB), developing, and hard baking. The first patterned photoresist layer 510 defines portions 515 of the HM 420 that are covered by first patterned photoresist layer 510 while the rest of the HM 420 is uncovered. In the present embodiment, each of the covered portions 515 of the HM 420 aligns to the respective interconnection via 315 and has a third width $w_3$, which is smaller than the first width $w_1$. In an embodiment, the third width $w_3$ is smaller than the second width $w_2$. In another embodiment, the third width $w_3$ is greater than the second width $w_2$. That is, in the present embodiment the third width $w_3$ is smaller than the width (i.e. first width $w_1$) of the top portion of interconnection via 315 and smaller than the width (i.e. second width $w_2$) of the bottom portion of interconnection via 315.

Figure 7:
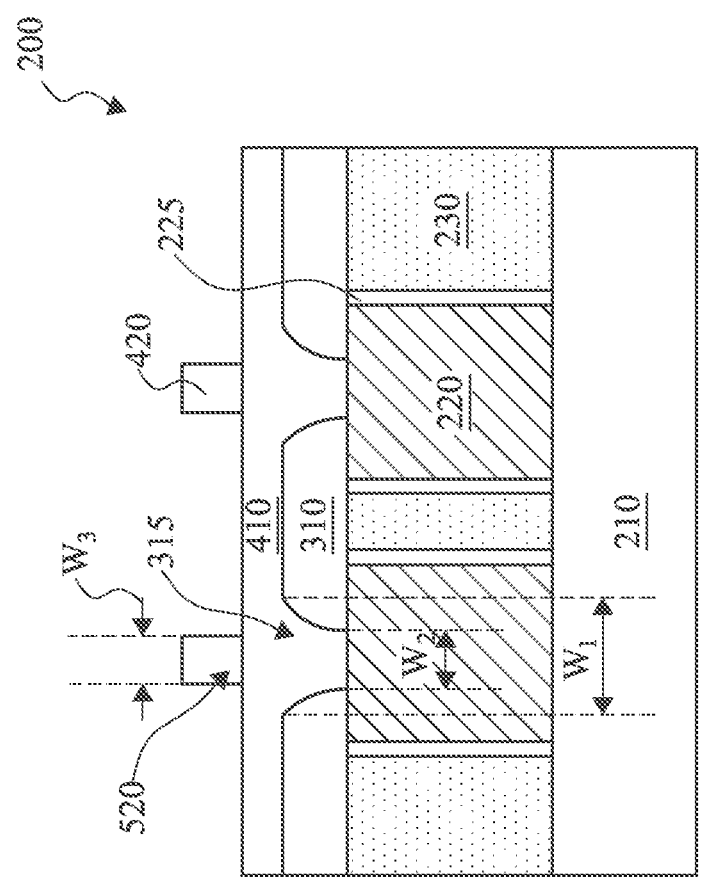

Referring to FIGS. 1 and 7, method 100 proceeds to step 114 by etching the HM 420 through the first patterned photoresist layer 510 such that portions 515 form HM mandrels 520. In the present embodiment, an anisotropic etch is performed to form the HM mandrel 520 with a vertical profile. The anisotropic etch may include a plasma etch by implementing chlorine-containing gas (e.g., $Cl_2$, $CHCl_3$, $CCl_4$, and/or $BCl_3$), bromine-containing gas (e.g. HBr and/or $CHBr_3$), iodine-containing gas, fluorine-containing gas (e.g., $CF_4$, $SF_6$, $CH_2F_2$, $CHF_3$, and/or $C_2F_6$), and/or other suitable gases and/or plasmas, and/or combinations thereof. As a result, each of the HM mandrels 520 carries the third width $w_3$. After forming the HM mandrels 520, the first patterned photoresist layer 510 is removed by wet stripping and/or plasma ashing.

Referring to FIGS. 1 and 8A, method 100 proceeds to step 116 by etching the first conductive layer 410 by using the HM mandrels 520 as an etch mask and the first ESL 310 as an etch-stop layer. Protected by the HM mandrels 520, portions of the first conductive layer 310 underneath respective the HM mandrels 520 form second conductive features 610. In the present embodiment, each of the second conductive features 610 is formed such that it has an upper portion 610U with a tapered profile and a lower portion 610L (within the interconnection via 315) with a reversed taper profile, as shown in FIGS. 8A and 8B. In other words, a shape of each of the second conductive features 610 is such that it has a third width $w_3$ at its top 610T, a forth width $w_4$ at its middle 610M and the second width at its bottom 610B. Among these three widths, the fourth width $w_4$ is the greatest. In an embodiment, the fourth width $w_4$ is same as the first width $w_1$. In another embodiment, the fourth width $w_4$ is smaller than the first width $w_1$ due to the first conductive layer 410 being etched down further.

In order to form the illustrated tapper profiles, in some embodiment, the etching parameters, such as etchant or an electric bias to a dry etching, can be continuously tuned to achieve the taper profile. A dry etching process may implement chlorine-containing gas (e.g., $Cl_2$, $CHCl_3$, $CCl_4$, and/or $BCl_3$), bromine-containing gas (e.g. HBr and/or $CHBr_3$), fluorine-containing gas (e.g., $CF_4$, $SF_6$, $CH_2F_2$, $CHF_3$, and/or $C_2F_6$), and/or other suitable gases and/or plasmas, and/or combinations thereof. In an embodiment, the dry etching process is performed by using gases of $Cl_2/CF_4$/HBr and argon sputtering.

In the present embodiment, the upper portion 610U serves as a bottom electrode and the lower portion 610L serves as an interconnection via feature. As a result, the bottom electrode 610U and the interconnection via feature 610L are formed simultaneously and inherit good physical contact to each other (one conductive feature). They also formed with different profiles/shapes.

Figure 9:
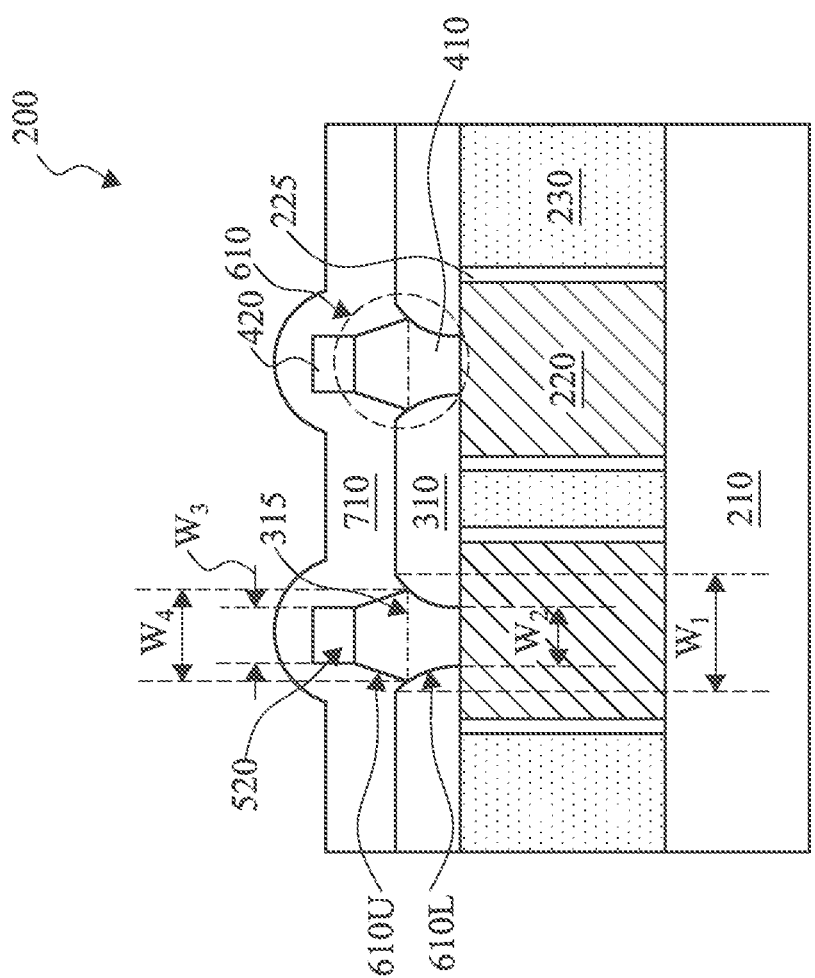

Referring to FIGS. 1 and 9, method 100 proceeds to step 118 by forming a second ESL 710 over the first ESL 310, including over the HM mandrel 520 and the upper portion 610U of the second conductive feature 610. The second ESL 710 is formed similarly in many respects to the first ESL 310 discussed above association with FIG. 3, including the materials discussed therein.

Figure 10:
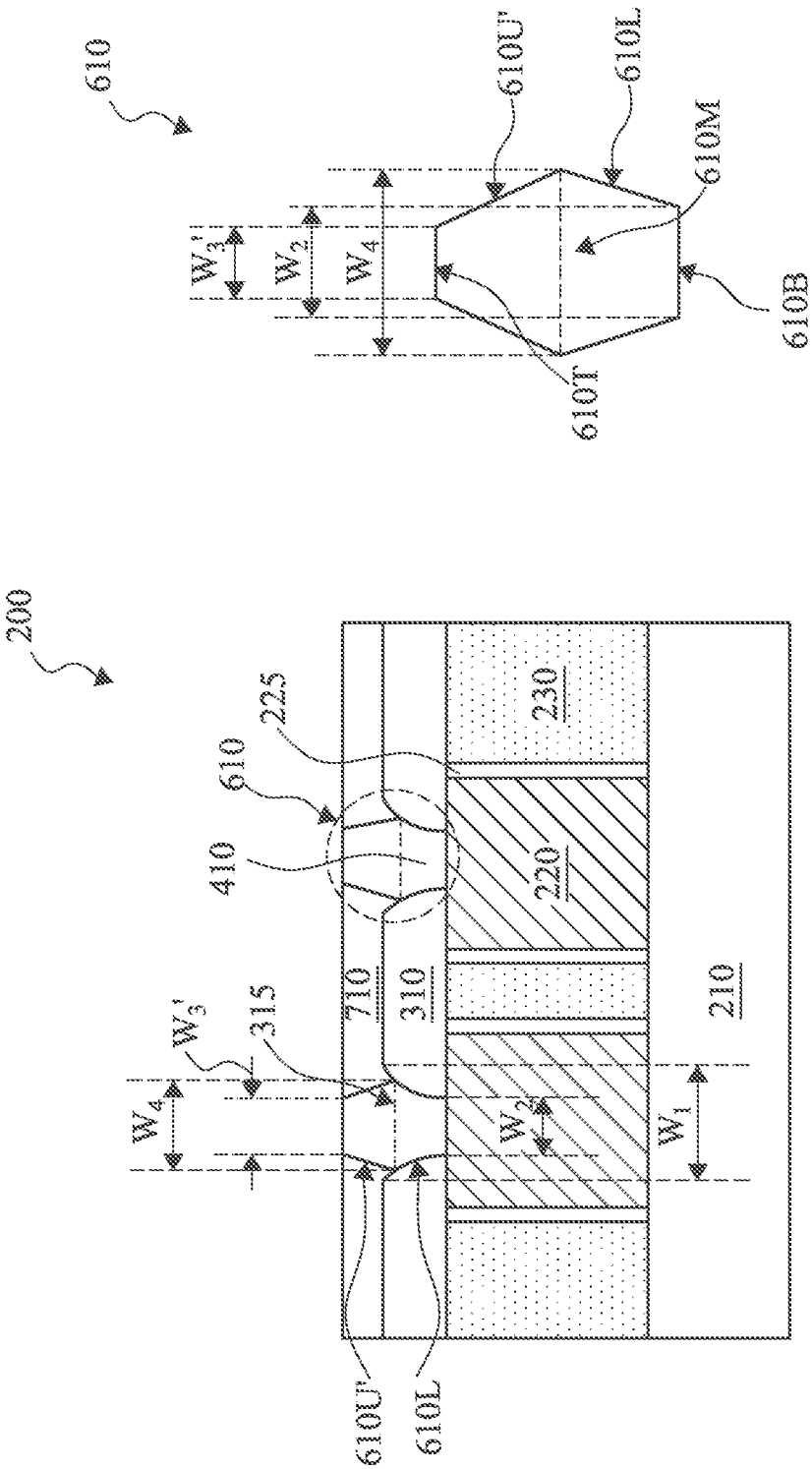

Referring to FIGS. 1, 10A and 10B, method 100 proceeds to step 120 by recessing the second ESL 710 and removing the HM mandrel 420 to planarize a top surface of the upper portion 610U of the second conductive feature 610. In the present embodiment, a CMP is performed to polish back the second ESL 710, remove the HM mandrel 420 and achieve a flat top surface of the upper portion 610U. In an embodiment, the upper portion 610U of the second conductive feature 610 may be polished back a little bit as well. Thus, after recessing process, the remaining upper portion 610U is referred to as 610U'. Because of its tapered profile, when the upper portion 610U is recessed, the width of its top surface (namely the third width $w_3$) becomes greater, referred to as the third width $w_3$'. In the present embodiment, the upper portion 610U' serves as a bottom electrode of the device 200 and the third width $w_3$' is designed to be smaller than the fourth width $w_4$. For a bottom electrode, a substantially flat top surface, where a stack of emerging memory films is to formed on, is important to decreases surface roughness of the stack of emerging memory films and improve magnetic and electrical properties of the device 200.

Figure 11:
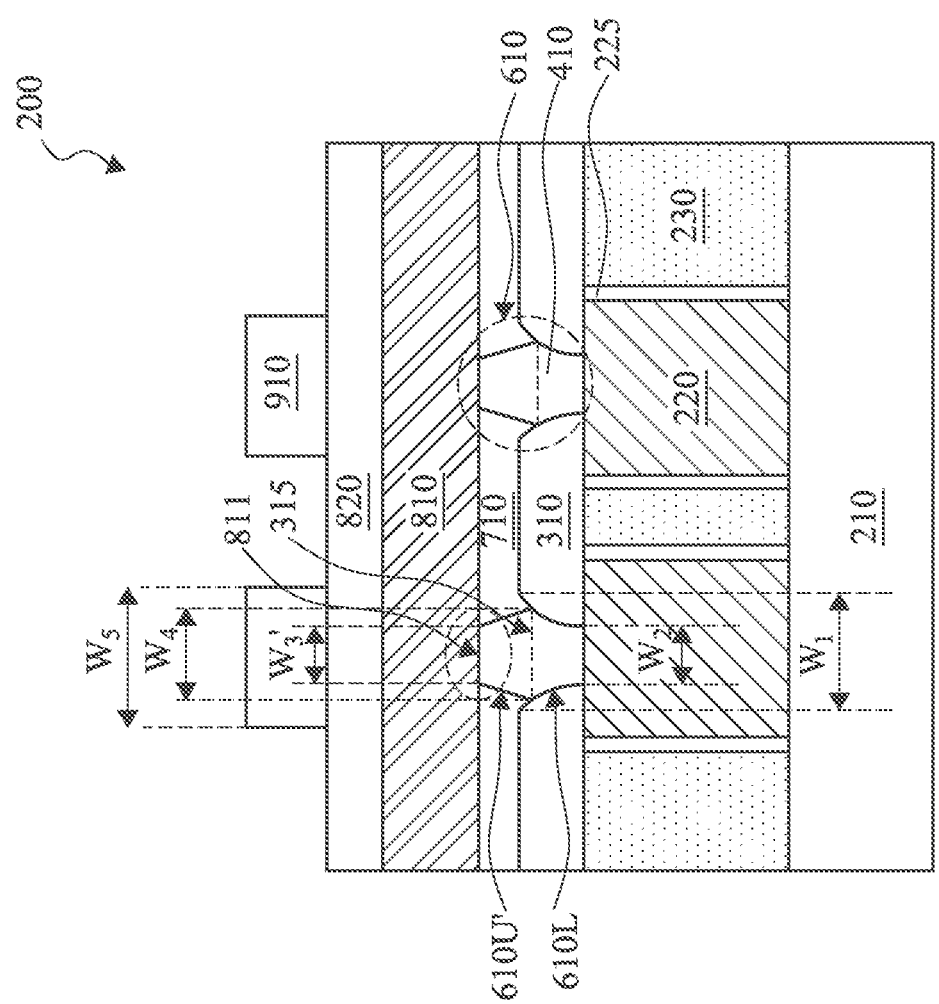

Referring to FIGS. 1 and 11, method 100 proceeds to step 122 by forming a stack of emerging memory films 810 over the upper portion 610U'. The stack of emerging memory films 810 may include multiple layers. It is noted that the stack of emerging memory films 810 is physically contact with the bottom electrode 610U'.

As has been mentioned above, in the present embodiment, the bottom electrode 610U' is formed with a smaller top width, namely the third width $w_{3'}$. Therefore a contact area 811 between the bottom electrodes 610U' and the stack of emerging memory films 810 is quite small and this is important for promoting desired characteristics and improving magnetic and electrical properties and reliability of the device 200.

In some embodiments, the stack of emerging memory films 810 includes a MTJ film stack, which includes a free layer disposed over the bottom electrode 610U', a barrier layer disposed over the free layer, a pin layer disposed over the barrier layer and an anti-ferromagnetic layer (AFL) disposed over the pin layer.

One or more of layers of the stack of emerging memory films 810 may be formed by various methods, including PVD process, CVD process, ion beam deposition, spin-on coating, metal-organic decomposition (MOD), ALD, and/or other methods known in the art.

Referring again to FIGS. 1 and 11, method 100 proceeds to step 124 by forming a second conductive layer 820 over the stack of emerging memory films 810. In the present embodiment, the second conductive layer 820 is formed similarly in many respects to the first conductive layer 410 discussed above associations with FIG. 5, including the materials discussed therein. In some embodiment, prior to forming the second conductive layer 820 a capping layer (not shown) is formed over the stack of emerging memory films 810 and then the second conductive layer 820 is formed over the capping layer. The capping layer may include titanium, hafnium, zirconium, and/or other suitable materials. The capping layer may be formed by PVD, CVD, ALD, and/or other suitable techniques.

Referring again to FIGS. 1 and 11, method 100 proceeds to step 126 by forming a second patterned photoresist layer 910 over the second conductive layer 820. The second patterned photoresist layer 910 defines the photoresist layer covering a portion of the second conductive layer 820 while leaving the rest of the conductive layer 820 uncovered. In the present embodiment, the covered portion of the second conductive layer 820 aligns to the interconnection via 315 and has a fifth width $w_5$, which is greater than the first width $w_1$. In some embodiment, the fifth width $w_5$ defines a width of a top electrode and a width of the stack of emerging memory films 810 underneath the top electrode to be formed. In some embodiment, the second patterned photoresist layer 910 is formed by a photolithography process including photoresist coating, soft baking, exposing, post-exposure baking (PEB), developing, and hard baking.

Figure 12:
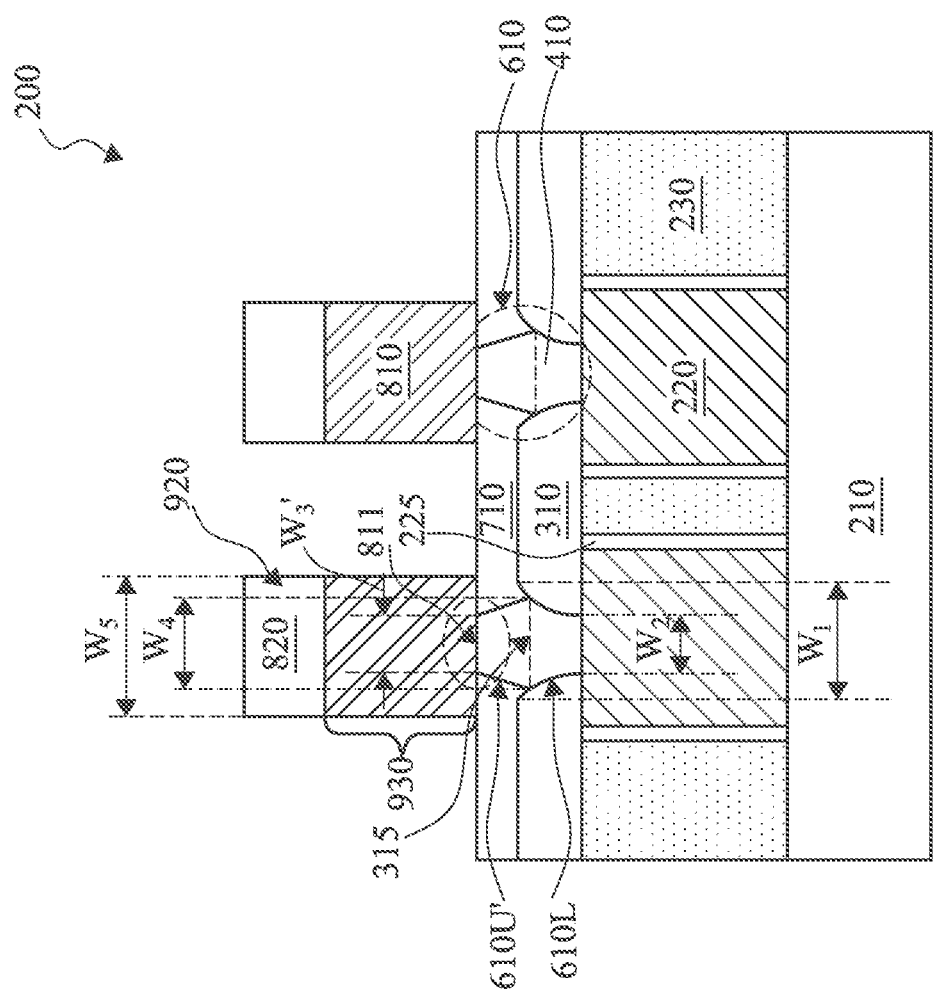

Referring to FIGS. 1 and 12, method 100 proceeds to step 128 by etching the second conductive layer 820 and the stack of emerging memory films 810 through the second patterned photoresist layer 910 to form a third conductive feature 920 and an emerging memory stack 930, respectively. In some embodiments, the third conductive feature 920 includes a top electrode and the emerging memory stack 930 includes a MJT.

The etch process may include a wet etch, a dry etch, and/or a combination thereof. The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. The etch process may include a multiple-step etching to gain etch selectivity, flexibility and desired etch profile. As has been mentioned previously, the second ESL 710 servers as an etch stop layer to relax etch process constraints and improve the etch process window. After forming the third conductive feature 920 and the stack 930, the second patterned photoresist layer 910 is removed by wet stripping and/or plasma ashing.

Figure 13:
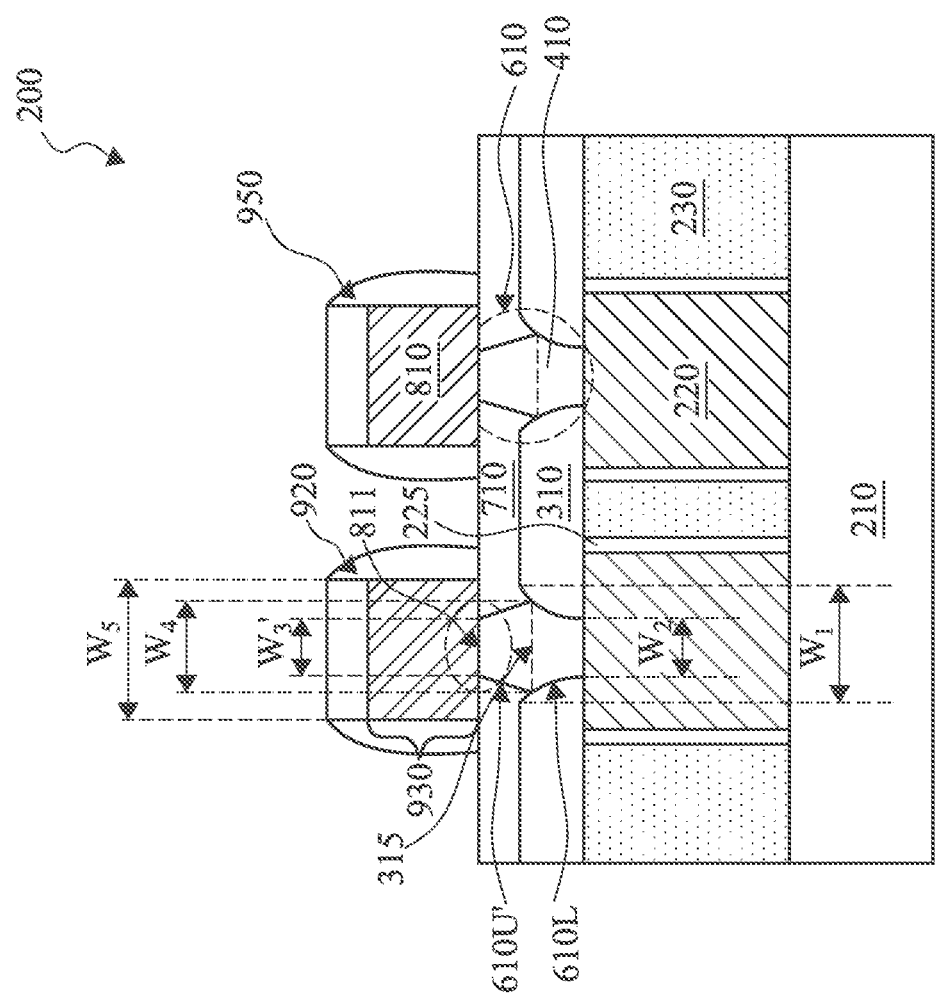

Referring to FIGS. 1 and 13, method 100 proceeds to step 130 by forming spacers 950 along sidewalls of the respective third conductive feature 920 and the emerging memory stack 930. In the present embodiment, the spacer 950 provides protection for the top electrode 920 and the emerging memory stack 930 to reduce current leakage and/or data retention. The spacers 950 may be formed by depositing a spacer material layer over the third conductive feature 920 and the second ESL 710, and followed by a spacer etch to etch the spacer material layer anisotropically. The spacer material layer may include silicon oxide, silicon nitride, oxynitride, silicon carbide, titanium oxide, titanium nitride, tantalum oxide, tantalum nitride, and/or any suitable materials. In the present embodiment, the spacer material layer includes a material which is different from the second conductive layer 820 and the second ESL 710 to achieve etch selectivity in subsequent etches. The spacer layer may be deposited by CVD, ALD, PVD, and/or other suitable techniques. In one embodiment, the spacer material layer is deposited by ALD to achieve conformable film coverage along the sidewalls of the third conductive feature 920 and the emerging memory stack 930.

Additional steps can be provided before, during, and after the method 100, and some of the steps described can be replaced or eliminated for other embodiments of the method.

Based on the above, the present disclosure offers methods for forming a bottom electrode with a flat top surface and a tapper profile for an emerging memory device. The method employs forming a reversed tapper profile for an interconnection via to relax gap filling constrains and a tapper profile for the bottom electrode to have a small contact area between the bottom electrode and an emerging memory stack for device performance enhancement. The method employs forming the interconnection via feature and the bottom electrode simultaneously to inherit good contact connection. The method demonstrates a feasible and well control process for bottom electrode formation.

The present disclosure provides many different embodiments of fabricating a semiconductor device that provide one or more improvements over existing approaches. In one embodiment, a method for fabricating a semiconductor device includes forming an opening with a tapered profile in a first material layer. An upper width of the opening is greater than a bottom width of opening. The method also includes forming a second material layer in the opening and forming a hard mask to cover a portion of the second material layer. The hard mask aligns to the opening and has a width smaller than the upper width of the opening. The method also includes etching the second material layer by using the hard mask as an etch mask to form an upper portion of a feature with a tapered profile.

In another embodiment, a method includes providing a substrate having a first conductive feature and forming a first etch-stop-layer (ESL) having a tapered opening. The tapered opening aligns to the first conductive feature and a portion of the first conductive feature is exposed within the tapered opening. The method also includes forming a first conductive layer in the tapered opening and extending to above the first ESL and forming a hard mask mandrel over the first conductive layer. The hard mask mandrel aligns with the tapered opening and a width of the hard mask mandrel is smaller than a width at the top of the tapered opening. The method also includes etching the first conductive layer by using the hard mask mandrel as an etch mask to form a bottom electrode with a tapered profile, forming a second ESL over the bottom electrode including over the hard mask mandrel, forming an emerging memory stack over the bottom electrode and forming a top electrode over the emerging memory stack.

In yet another embodiment, a device includes a bottom electrode having a tapered profile such that a width at a top portion of the bottom electrode is smaller than a width at a bottom portion of the bottom electrode. The device also includes an emerging memory stack disposed over the bottom electrode. A width of the emerging memory stack is wider than the width at the top portion of the bottom electrode. The device also includes a top electrode disposed over the emerging memory stack and spacers disposed along sidewalls of the emerging memory stack and the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a substrate having a top surface;
a first electrode disposed on the substrate, the first electrode including a first outer edge, a second outer edge interfacing with the first outer edge, a third outer edge and a fourth outer edge interfacing with the third outer edge, wherein the first, second, third and fourth outer edges are non-orthogonal to the top surface of the substrate, wherein a top surface of the first electrode extends from first outer edge to the third outer edge;
a material layer interfacing with the first outer edge and the third outer edge of the first electrode, the material layer being formed of a different material than the first electrode; and
a memory structure having a first sidewall and opposing second sidewall and a bottom surface extending from the first sidewall to the second sidewall of the memory structure, wherein the top surface of the first electrode physically contacts the bottom surface of the memory structure, and wherein the bottom surface of the memory structure physically contacts a portion of the material layer.

2. The device of claim 1, wherein the bottom surface of the memory structure is longer than the top surface of the first electrode.

3. The device of claim 1, further comprising a sidewall spacer disposed along the first sidewall of the memory structure, the sidewall spacer physically contacting the material layer.

4. The device of claim 1, further comprising a first conductive feature disposed on the substrate, and
wherein the first electrode interfaces with the first conductive feature.

5. The device of claim 1, wherein the first conductive feature includes a feature selected from the group consisting of a gate stack, a source/drain feature, a metal line, a contact, and a via feature.

6. The device of claim 1, further comprising a second electrode disposed on the memory structure.

7. The device of claim 1, wherein a bottom surface of the first electrode extends from second outer edge to the fourth outer edge, and
wherein the bottom surface of the first electrode is longer than the top surface of the first electrode.

8. A device comprising:
a bottom electrode having a variable width from a top surface to a bottom surface of the bottom electrode;
a memory structure having a first sidewall and opposing second sidewall and a bottom surface extending from the first sidewall to the second sidewall of the memory structure, wherein the bottom surface of the memory structure covers the entire top surface of the bottom electrode and extends beyond the top surface of the bottom electrode on at least one side of the bottom electrode;
a dielectric sidewall spacer disposed along and physically contacting the first sidewall of the memory structure;
a top electrode physically contacting the memory structure; and
a first etch stop layer disposed on and physically contacting at least one side of the bottom electrode, wherein the memory structure does not physically contact the first etch stop layer.

9. The device of claim 8, wherein the bottom surface of the memory structure extends beyond the top surface of the bottom electrode on opposing sides of the bottom electrode.

10. The device of claim 8, further comprising a second contact etch stop layer, and
wherein the first and second contact etch stop layers physically contact the bottom electrode.

11. The device of claim 10, wherein the dielectric sidewall spacer physically contacts at least one of the first and second contact etch stop layers.

12. The device of claim 8, further comprising:
a dielectric layer; and
a conductive feature disposed within the dielectric layer, and
wherein the bottom electrode physically contacts the conductive feature.

13. The device of claim 12, further comprising a barrier layer disposed on the conductive feature thereby preventing the dielectric layer form interfacing with the conductive feature.

14. The device of claim 8, wherein the top electrode has a constant width from a top surface to a bottom surface of the top electrode.

15. The device of claim 8, wherein the dielectric sidewall spacer is disposed along and physically contacting a sidewall of the top electrode.

16. A device comprising:
a semiconductor substrate having a top surface;
a dielectric material layer disposed on the semiconductor substrate;
a conductive feature disposed within the dielectric material layer;
a memory structure disposed over the conductive feature;
a first electrode extending from the conductive feature to the memory structure, wherein the first electrode includes a first outer edge, a second outer edge interfacing with the first outer edge, a third outer edge and a fourth outer edge interfacing with the third outer edge, wherein the first, second, third and fourth outer edges are non-orthogonal to the top surface of the substrate, wherein a top surface of the first electrode extends from first outer edge to the third outer edge and physically contacts the memory structure, wherein a bottom surface of the first electrode extends from second outer edge to the fourth outer edge and physically contacts the conductive feature, wherein the bottom surface is longer than the top surface of the first electrode; and a first etch stop layer disposed on either side of the first electrode and physically contacting the first electrode, wherein the memory structure does not physically contact the first etch stop layer.

17. The device of claim 16, wherein the conductive feature includes a feature selected from the group consisting of a gate stack, a source/drain feature, a metal line, a contact and a via feature.

18. The device of claim 16, further comprising a second etch stop layer disposed on either side of the first electrode and physically contacting the first electrode.

19. The device of claim 18, wherein the memory structure physically contacts the second etch stop layer.

20. The device of claim 16, further comprising a second electrode disposed directly on a top surface of the memory structure such that the second electrode physically contacts the memory structure, and wherein the second electrode has a different cross-sectional profile shape than the first electrode.

* * * * *